United States Patent
Tian et al.

(10) Patent No.: US 10,186,562 B2
(45) Date of Patent: Jan. 22, 2019

(54) THIN FILM TRANSISTOR AND MANUFACTURING METHOD THEREOF, ARRAY SUBSTRATE AND ORGANIC LIGHT EMITTING DISPLAY PANEL

(71) Applicants: BOE Technology Group Co., Ltd., Beijing (CN); BEIJING BOE OPTOELECTRONICS TECHNOLOGY CO., LTD., Beijing (CN)

(72) Inventors: Zongmin Tian, Beijing (CN); Zhenyu Xie, Beijing (CN); Xu Chen, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/415,909

(22) PCT Filed: May 29, 2014

(86) PCT No.: PCT/CN2014/078846
§ 371 (c)(1),
(2) Date: Jan. 20, 2015

(87) PCT Pub. No.: WO2015/103837
PCT Pub. Date: Jul. 16, 2015

(65) Prior Publication Data
US 2016/0043152 A1   Feb. 11, 2016

(30) Foreign Application Priority Data
Jan. 10, 2014   (CN) .......................... 2014 1 0012665

(51) Int. Cl.
*H01L 27/32* (2006.01)
*H01L 51/05* (2006.01)
(Continued)

(52) U.S. Cl.
CPC ...... *H01L 27/3248* (2013.01); *H01L 27/3246* (2013.01); *H01L 27/3262* (2013.01);
(Continued)

(58) Field of Classification Search
CPC .......... H01L 51/0562; H01L 51/0508–51/057; H01L 51/5296; H01L 51/105; H01L 51/50–51/5036
See application file for complete search history.

(56) References Cited

U.S. PATENT DOCUMENTS

2009/0085033 A1*   4/2009   Su ..................... H01L 29/78696
                                                                257/59
2009/0134401 A1*   5/2009   Maekawa ........... H01L 27/1292
                                                                257/72
(Continued)

FOREIGN PATENT DOCUMENTS

CN          101814530 A          8/2010
CN          101866954 A    *    10/2010
(Continued)

OTHER PUBLICATIONS

Nov. 27, 2015—(CN)—First Office Action Appn 201410012665.4 with English Tran.
(Continued)

*Primary Examiner* — Marc Armand
*Assistant Examiner* — Quinton Brasfield
(74) *Attorney, Agent, or Firm* — Banner & Witcoff, Ltd.

(57) ABSTRACT

A thin film transistor, a method for manufacturing the thin film transistor, an array substrate comprising the thin film transistor and an organic light emitting display panel com-
(Continued)

prising the thin film transistor are provided. The thin film transistor at least comprising an active layer made of carbon nanotube material with semiconductor properties or graphene with semiconductor properties; further comprising a first conductive layer and a second conductive layer respectively located on upper and lower sides of the active layer and in contact with the active layer, the first conductive layer and the second conductive layer formed a secondary electron emitting layer with electron multiplication function. The thin film transistor is advantageous in its simple structure and simple manufacturing process.

8 Claims, 2 Drawing Sheets

(51) Int. Cl.
    *H01L 29/66*     (2006.01)
    *H01L 29/45*     (2006.01)
    *H01L 29/786*     (2006.01)
    *H01L 29/16*     (2006.01)
    *H01L 51/00*     (2006.01)
    *H01L 51/56*     (2006.01)
    *H01L 51/52*     (2006.01)

(52) U.S. Cl.
    CPC ...... *H01L 27/3274* (2013.01); *H01L 29/1606* (2013.01); *H01L 29/45* (2013.01); *H01L 29/66045* (2013.01); *H01L 29/66742* (2013.01); *H01L 29/66969* (2013.01); *H01L 29/78684* (2013.01); *H01L 29/78696* (2013.01); *H01L 51/0048* (2013.01); *H01L 51/5218* (2013.01); *H01L 51/5221* (2013.01); *H01L 51/56* (2013.01); *H01L 51/0097* (2013.01); *H01L 51/0545* (2013.01); *H01L 51/0562* (2013.01); *H01L 51/5206* (2013.01); *H01L 51/5234* (2013.01); *H01L 2227/323* (2013.01); *H01L 2251/301* (2013.01); *H01L 2251/5338* (2013.01)

(56) References Cited

U.S. PATENT DOCUMENTS

| | | | |
|---|---|---|---|
| 2010/0155847 | A1 | 6/2010 | Do et al. |
| 2010/0163863 | A1* | 7/2010 | Yaegashi ............. H01L 29/7869 |
| | | | 257/43 |
| 2012/0113341 | A1 | 5/2012 | Uochi |
| 2012/0178196 | A1* | 7/2012 | Park .................... H01L 27/1288 |
| | | | 438/34 |
| 2012/0305892 | A1 | 12/2012 | Thornton et al. |
| 2014/0077160 | A1 | 3/2014 | Dai et al. |
| 2014/0145178 | A1* | 5/2014 | Lee .................... H01L 29/66969 |
| | | | 257/43 |
| 2014/0217397 | A1* | 8/2014 | Kwak ................. H01L 27/1218 |
| | | | 257/43 |

FOREIGN PATENT DOCUMENTS

| | | |
|---|---|---|
| CN | 102629577 A | 8/2012 |
| CN | 102881828 A | 1/2013 |
| CN | 103236442 A | 8/2013 |
| CN | 203445122 U | 2/2014 |
| CN | 103762247 A | 4/2014 |
| CN | 203674269 U | 6/2014 |

OTHER PUBLICATIONS

International Search Report and Written Opinion dated Sep. 5, 2014 (PCT/CN2014/078846); ISA/CN.
Jul. 12, 2016—International Preliminary Report on Patentability Appn PCTCN2014078846.

\* cited by examiner

THIN FILM TRANSISTOR AND MANUFACTURING METHOD THEREOF, ARRAY SUBSTRATE AND ORGANIC LIGHT EMITTING DISPLAY PANEL

The application is a U.S. National Phase Entry of International Application No. PCT/CN2014/078846 filed on May 29, 2014, designating the United States of America and claiming priority to Chinese Patent Application No. 201410012665.4 filed on Jan. 10, 2014. The present application claims priority to and the benefit of the above-identified applications and the above-identified applications are incorporated by reference herein in their entirety.

TECHNICAL FIELD

Embodiments of the present disclosure relate to a thin film transistor and a manufacturing method thereof, an array substrate and an organic light emitting display panel.

BACKGROUND

An organic light emitting display panel refers to a panel comprising an organic light emitting device, for example an OLED (Organic Light Emitting Diode) or other organic electroluminescent (EL) elements. The most common light emitting device is an OLED. An organic light emitting display panel is a panel that utilizes an organic light emitting display device, wherein every pixel structure of the panel comprises one organic light emitting device. Because an organic light emitting device is a self-illuminating display device, so such a display panel does not require a backlight. An organic light emitting device is gradually becoming a shinny spot in the field of flat panel display and will play an important role because of its advantage of thinness, lightness, self-illuminating, broad view angle, high sharpness, high brightness, quick response, low energy consumption, broad operating temperature range, resistance to vibration and so on.

An OLED light emitting device is a light emitting device of current driving type which requires a large driving current during normal operation. The larger the driving current that is provided by a driving circuit for the OLED, normal work of the OLED is better guaranteed, allowing decrease in energy consumption of the OLED. A thin film transistor (TFT) driving an OLED to emit light is very important, and the higher mobility carriers in an active layer of the TFT have, the larger the driving current driving the OLED is.

Currently, the TFT in an OLED display panel mainly comprises an amorphous silicon TFT and a low temperature polysilicon TFT. The carriers in a low temperature polysilicon TFT have a mobility greater than that of the carriers in the amorphous silicon TFT by at least two orders. Therefore, most of TFTs in current OLED display panels are low temperature polysilicon TFTs.

The current conditions for making a low temperature polysilicon TFT are relatively harsh, and generally require deposition of amorphous silicon, performing a dehydrogening process afterwards, performing a laser annealing after the process and then exposing and etching, which needs at least 3-4 masking processes. The whole process is complicated and has a low yield. Moreover, a low temperature polysilicon TFT is prepared at a high temperature and is not appropriate to be prepared on a flexible substrate.

SUMMARY

Embodiments of the present disclosure provide a thin film transistor with advantages of having a simple structure and a simple manufacturing process.

2

A thin film transistor according to at least one embodiment of the present disclosure at least comprises an active layer made of a carbon nanotube material with semiconductor properties or a graphene material with semiconductor properties; further comprises a first conductive layer and a second conductive layer, respectively located on upper and lower sides of the active layer and in contact with the active layer; each of the first conductive layer and the second conductive layer is formed of a secondary electron emitting layer having an electron multiplication function.

According to an embodiment of the present disclosure, the secondary electron emitting layer having an electron multiplication function is made of a metal oxide or a metal organic compound.

According to an embodiment of the present disclosure, the first conductive layer has a thickness of 40-50 nm, the second conductive layer has a thickness of 40-50 nm.

According to an embodiment of the present disclosure, the carbon nanotube with semiconductor properties is an oxidized carbon nanotube, the graphene with semiconductor properties is a hydrogenized graphene.

According to an embodiment of the present disclosure, further comprises source/drain electrodes made of the carbon nanotube with conductor properties or the graphene with conductor properties; the second conductive layer disposed between the source/drain electrodes and the active layer and corresponding to the source/drain electrodes.

At least one of the embodiments of the present disclosure provides an array substrate, comprising a base substrate and a plurality of pixel units in an array disposed on the base substrate, each of the plurality of pixel units comprising the thin film transistor described above.

According to an embodiment of the present disclosure, the array substrate further comprises an organic light emitting device disposed in each of the pixel units, the organic light emitting device at least comprising a cathode, an anode and a light emitting layer sandwiched between the cathode and the anode that are laminated, the anode being connected to the drain of the thin film transistor;

wherein at least one of the cathode and the anode is made of conductive carbon nanotube or conductive graphene.

According to an embodiment of the present disclosure, the organic light emitting device further comprises a conductive film layer with a light reflective function stacked with the anode; or the organic light emitting device further comprises a conductive film layer with a light reflective function stacked with the cathode.

According to an embodiment of the present disclosure, the base substrate is a flexible substrate.

According to at least one of the embodiments of the present disclosure, an organic light emitting display panel comprising the above array substrate is provided.

According to at least one of the embodiments of the present disclosure, a method for manufacturing a thin film transistor is provided, comprising the following steps:

a step of manufacturing an active layer, and a first conductive layer and a second conductive layer respectively disposed on upper and lower sides of the active layer and in contact with the active layer;

the active layer made of a carbon nanotube with conductor properties or a graphene with conductor properties, each of the first conductive layer and the second conductive layer formed of a secondary electron emission layer with an electron multiplication function.

According to an embodiment of the present disclosure, the secondary electron emission layer with an electron multiplication function is made of a metal oxide or a metal organic compound.

According to an embodiment of the present disclosure, the thin film transistor further comprises source/drain electrodes, the method further comprising:

a step of manufacturing source/drain electrodes, the source/drain electrodes being made of a conductive carbon nanotube or conductive graphene.

According to an embodiment of the present disclosure, the step of manufacturing an active layer and a first conductive layer and a second conductive layer respectively disposed on upper and lower sides of the active layer and in contact with the active layer comprises:

depositing a layer of a secondary electron emission layer with an electron multiplication function on the base substrate so as to form patterns of the first conductive layer;

depositing a layer of a carbon nanotube film layer subjected to an ultraviolet light irradiation and an oxidation treatment on the base substrate formed with the secondary emission layer with an electron multiplication function, or depositing a layer of graphene film layer subjected to a hydrogen or argon treatment, so as to form patterns of the active layer;

forming again a layer of a secondary electron emission layer with an electron multiplication function on the base substrate formed with the layer of carbon nanotube film or the layer of graphene film, to form patterns of the second conductive layer;

performing a patterning process to the two layers of the secondary electron emission layer on the base substrate and the layer of carbon nanotube film or the layer of graphene film disposed between the two secondary electron emission layers, so as to form patterns of the first conductive layer, patterns of the active layer and patterns of the second conductive layer, and the patterns of the second conductive layer being located between the source/drain electrodes to be formed and the active layer and corresponding to the source/drain electrodes to be formed.

According to an embodiment of the present disclosure, the step of manufacturing the source/drain electrodes which are made of a carbon nanotube or graphene with conductor properties specifically is:

depositing a layer of a carbon nanotube or a layer of graphene film with conductor properties on the base substrate formed with the patterns of the first conductive layer, the patterns of the active layer and the patterns of the second conductive layer;

performing a patterning process to the carbon nanotube layer or the graphene film layer with conductor properties, so as to form patterns of the source/drain electrodes on the patterns of the second conductive layer.

According to an embodiment of the present disclosure, the first conductive layer has a thickness of 40-50 nm, the second conductive layer has a thickness of 40-50 nm.

According to at least one embodiments of the present disclosure provides a method for manufacturing an array substrate, comprising a step of manufacturing a thin film transistor of each pixel unit and a step of manufacturing an organic light emitting display device;

the step of manufacturing the thin film transistor being realized by performing the above method for manufacturing a thin film transistor.

According to an embodiment of the present disclosure, the step of manufacturing the organic light emitting display device comprises:

forming patterns of an anode formed of carbon nanotube with conductor properties or graphene with conductor properties, on the base substrate formed with the thin film transistor, the anode connected with the drain of the thin film transistor;

forming patterns of a pixel defining layer on the base substrate formed with the patterns of the anode;

forming patterns of a light emitting layer on the base substrate formed with the patterns of the pixel defining layer;

forming patterns of a cathode on the light emitting layer formed of carbon nanotube or graphene with conductor properties, on the base substrate formed with the patterns of the light emitting layer.

According to an embodiment of the present disclosure, forming patterns of an anode made of carbon nanotube or graphene with conductor properties on the base substrate formed with the patterns of the thin film transistor comprises:

on the base substrate formed with the thin film transistor, sequentially forming a conductive film layer with a light reflective function and a conductive film layer made ofcarbon nanotube material or graphene with conductor properties on the conductive film layer having a light reflective function;

forming the patterns of the anode on the base substrate formed with the conductive film layer through a patterning process.

According to an embodiment of the present disclosure, forming patterns of a cathode on the light emitting layer made of carbon nanotube or graphene with conductor properties, on the base substrate formed with the patterns of the light emitting layer, comprises:

on the base substrate formed with the patterns of the light emitting layer, forming a conductive film layer with a light reflective function on the light emitting layer and a conductive film layer made of carbon nanotube or graphene with conductor properties on the conductive film layer with a light reflective function;

forming the patterns of the cathode of the organic light emitting device on the base substrate formed with the conductive film layer through a patterning process.

In the thin film transistor according to embodiments of the present disclosure, as the active layer is made of carbon nanotube with semiconductor properties or a graphene with semiconductor properties, the active layer, the first conductive layer and the second conductive layer can be manufactured only through a process condition similar to a chemical vapor deposition method or a coating method, and the first conductive layer and the second conductive layer have secondary electron emission layers with an electron multiplication function. When the thin film transistor TFT works, electrons enter into the first conductive layer and the second conductive layer through the active layer. The electrons will be accelerated forwards spirally because the first conductive layer and the second conductive layer have a secondary electron emission layer with an electron multiplication function. During this process, collision will occur for multiple times so that electrons multiply and the electrons output finally increase exponentially such that mobility of the electrons improves and the mobility of the carriers increases to a degree comparable to the mobility of the carriers of a low temperature polysilicon.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the invention.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide a thin film transistor, a manufacturing method thereof, an array substrate and an organic light-emitting device display panel, so as to provide a thin film transistor, an array substrate and an organic light-emitting display panel, with a simple structure and with relatively simple manufacturing processes.

A TFT according to embodiments of the present disclosure only requires a process condition similar to a chemical vapor phase deposition method or a coating method and are capable of manufacturing a TFT with a high carrier mobility property which a low temperature polysilicon has, which lowers complexity of the process for a high performance TFT.

A TFT, a manufacturing method thereof, an array substrate and a display device according to embodiments of the present disclosure will be described below in connection with figures.

Embodiment 1: Thin Film Transistor

Figure 1:
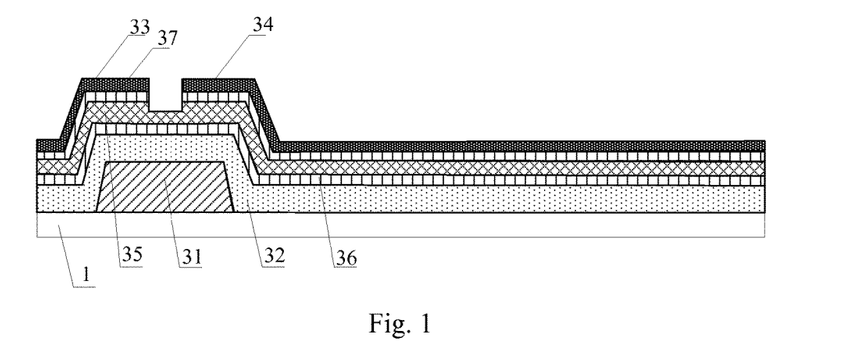
FIG. 1 is a view schematically illustrating a structure of a TFT according to a first embodiment of the present disclosure.

A thin film transistor according to an embodiment of the present disclosure will be described hereinafter by taking FIG. 1 as an example. As illustrated in FIG. 1, the thin film transistor at least comprises an active layer 35, and further comprises a first conductive layer 36 and a second conductive layer 37 disposed on upper and lower sides of the active layer 35 and in contact with the active layer 35, that is, the active layer 35 is interposed between the first conductive layer 36 and the second conductive layer 37; wherein the active layer 35 is made of carbon nanotube material with semiconductor properties or graphene with semiconductor properties; the first conductive layer 36 and the second conductive layer 37 are formed of a secondary electron emission layer having electron multiplication function.

The thin film transistor generally further comprises a gate 31, a gate insulating layer 32 over the gate 31, an active layer 35 over the gate insulating layer 32, source/drain electrodes 33/34 over the active layer 35 and etc.

In the thin film transistor according to the embodiment, the active layer is made of carbon nanotube with semiconductor properties and graphene with semiconductor properties. It is possible to manufacture the active layer, the first conductive layer and the second conductive layer only through a process condition similar to a chemical vapor deposition method or a coating method well known in the prior art. And thus times of deposition is reduced, damage and difference in match degree between layers due to difference in manufacturing processes for various layers are reduced, the manufacturing process is simplified with a low cost and a good yield. Besides, the first conductive layer and the second conductive layer are formed of a secondary electron emission layer with an electron multiplication function. When the thin film transistor works, electrons enter into the first conductive layer and the second conductive layer through the active layer, as the first conductive layer and the second conductive layer have secondary electron emission properties with an electron multiplication function, the electrons will be accelerated forwards spirally, during this process collisions between electrons will occur for multiple times, so that an electron multiplication effect will be produced and finally the output electrons increase exponentially, increasing the mobility of the electrons and making the carriers have a mobility comparable to mobility of the carriers of the low temperature polysilicon.

In an implementation of the embodiment, the secondary electron emission layer with an electron multiplication function is made of a metal oxide or a metal organic compound.

For example, the metal oxide may be MgO or BeO and etc. The metal organic compound is also called an organic metal compound, referring to a generic term of compounds formed by bonding alkyl (including methyl, ethyl, propyl, butyl and etc.) and aryl (phenyl etc.) with metal atoms, and substances formed by directly bonding carbon atoms and metal atoms, for example, lithium, sodium, magnesium, calcium, zinc, cadmium, mercury, beryllilum, aluminium, tin, lead and the like, can produce a stable metal organic compound. The metal oxides and the metal organic compounds all have an electron multiplication function, and can be used as a secondary electron emission layer, and of course other film layer with an electron multiplication function can be used as a secondary electron emission layer, which will not be limited herein.

Multiple of the electron multiplication is related to the thin film thickness of the secondary electron emission layer. The improvement degree of the TFT performance can be adjusted by controlling the thin film thickness. Commonly, the thickness of a secondary electron emission layer is not suitable to be too thick or too thin, and the thicknesses of the first conductive layer and the second conductive layer according to the embodiment of the present disclosure are between 40-50 nm (400-500 Å), respectively, so that the multiple of the electronic multiplication reaches up to 150 or more.

The carbon nanotube and the graphene can be used as a conductor and can be used as a semiconductor after an appropriate process treatment due to their special structures. For example, the carbon nanotube can be made into a semiconductor through an oxidation process by irradiation of an ultraviolet light and the graphene can be made into a semiconductor through $H_2$ or Ar treatment. In the present embodiment, the carbon nanotube with semiconductor properties can be a carbon nanotube which has semiconductor properties undergone an ultraviolet light irradiation and oxidation treatment, which can be simply referred to as an oxidized carbon nanotube. As a nanomaterial, the oxidized carbon nanotube has a light weight and a good mechanical, electrical and chemical performance. The graphene with semiconductor properties can be a graphene with semiconductor properties undergone a hydrogenization treatment, which can be simply referred to as hydrogenised graphene, components of which are more purified and can better exert properties of the graphene. The specific processes for treating nanotube and graphene are similar to techniques known to the inventor and will not be described redundantly.

The source/drain electrodes of the thin film transistor are formed of the nanotube and the graphene with conductor properties, and the second conductive layer is located between the source/drain electrodes and the active layer and is disposed corresponding to the source/drain electrodes.

For example, taking a bottom gate type TFT as an example, as illustrated in FIG. 1, the second conductive layer 37 is disposed under the source/drain electrodes 33/34, the second conductive layer 37 under the source electrode 33 is provided opposite to the second conductive layer 37 under the drain electrode 34 so as to form a slit with a preset width, the slit corresponding to a slit formed between the source/drain electrodes 33/34. That is to say, the second conductive layer 37 is disposed under the source/drain electrodes 33/34, respectively, and the second conductive layer 37 has a slit so as to prevent the source/drain electrodes 33/34 from being electrically connected. Such arrangement can further guarantee insulation between the source/drain electrodes 33/34.

It should be noted that, the TFT illustrated in FIG. 1 is a bottom gate type TFT, and the thin film transistor according to the embodiment of the present disclosure can also be a top gate type TFT, a side gate type TFT or a double gate type TFT and the like, which will not be specifically defined.

For example, when a top gate type TFT is utilized, the detail structure of the this type of TFT is that the source/drain electrodes are disposed below the active layer, the gate insulating layer is disposed above the active layer and the gate is disposed above the gate insulating layer while the first conductive layer and the second conductive layer are remained on upper and lower sides of the active layer, respectively, and in contact with the active layer, with the first conductive layer disposed over the active layer, the second conductive layer disposed below the active layer and the second conductive layer disposed over the source/drain electrodes.

In other types of TFTs, the arrangements of the first conductive layer and the second conductive layer, the active layer, the source/drain electrodes are similar to those in the above embodiment and will not be described again.

Embodiment 2: Array Substrate

The array substrate according to the second embodiment of the present disclosure is similar to conventional techniques, and comprises a base substrate and a plurality of pixel units disposed on the base substrate in an array, with each pixel unit comprising at least one thin film transistor which is a thin film transistor according to the above embodiment.

The configurations of the thin film transistor and an OLED in an organic light emitting display panel will be described hereafter.

Figure 2:
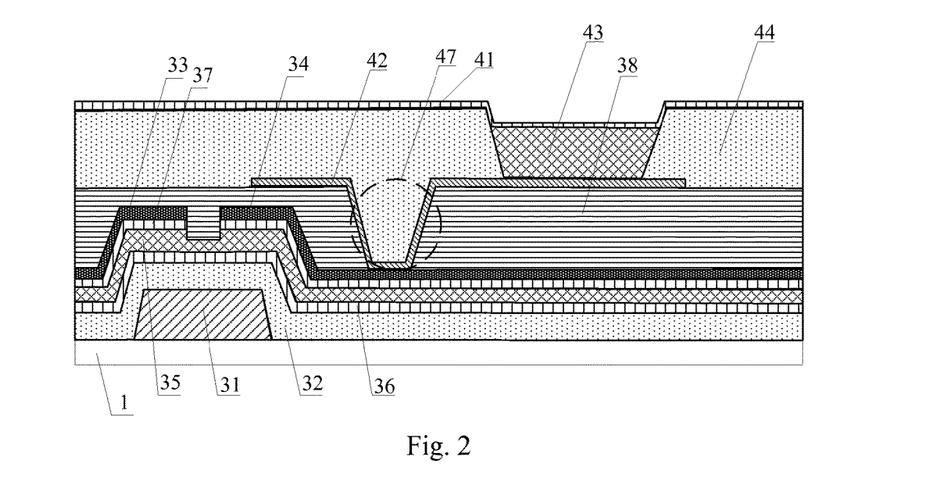
FIG. 2 is a view schematically illustrating a structure of an array substrate according to a second embodiment of the present disclosure.

Referring to FIG. 2, the array substrate according to the second embodiment of the present disclosure further comprises an OLED disposed in each pixel unit, the OLED at least comprising a cathode 41, an anode 42 (also called as a pixel electrode) and a light emitting layer 43 between the cathode 41 and the anode 42, which are laminated, wherein the anode 42 is connected to the drain 34 in the thin film transistor; and wherein at least one of the cathode 41 and anode 42 are made of the carbon nanotube or graphene with conductor properties.

In the array substrate according to the second embodiment of the present disclosure, at least one of the cathode and the anode of the OLED is made of carbon nanotube or graphene with conductor properties, and exhibit a good conductive performance, as atoms of the carbon nanotube or the graphene are arranged in order in a long range.

Compared with a metal or a metal oxide known to the inventor used as a cathode 41 and an anode 42 of the OLED, the carbon nanotube or the graphene with conductor properties has a better conducting performance, the carriers of the OLED have a better carrier mobility property and is advantageous in improving light emitting performance of the OLED.

In the OLED according to the second embodiment of the present disclosure, the cathode, the light emitting layer and the anode can be stacked on the base substrate in order, with the positions of the cathode and the anode interchangeable. It is needed to ensure that the anode and the drain of the thin film transistor are connected to each other regardless of the manner in which they are arranged. As illustrated in FIG. 2, the anode 42 of the OLED is disposed over the base substrate 1, the light emitting layer 43 is disposed over the anode 42, and the cathode 41 is disposed over the light emitting layer 43. The configuration of the OLED can be determined according to actual requirements, which will not be specifically defined.

Furthermore, as the carbon nanotube or the graphene with conductor properties is a transparent conductive film layer, the anode further comprises a conductive film layer with a light reflective function stacked with the anode; and/or the cathode further comprises a conductive film layer with a light reflective function stacked with the cathode. The conductive film layer can be a film layer formed by Mo, Al or Molybdenum alloy with a light reflective function.

The anode of the OLED comprises a conductive film layer with a light reflective function disposed on the substrate and a carbon nanotube or a graphene conductive film layer with conductor properties configured for an anode disposed on the conductive film layer with a light reflective function.

The anode of the OLED according to the embodiment of the present disclosure adopts a double-layer conductive film layer, that is, combining an opaque conductive film layer with a transparent conductive film layer. By efficiently combining patterns on the TFT base substrate with the anode of the OLED, block of light by the anode wiring and the patterns on the base substrate can be reduced, so that the light emitting area is increased; and since the anode is designed as double-layered, that is, combining the opaque metal with the transparent conductive thin film, light reflected by the anode can be efficiently utilized so that the reflected light goes through the organic light emitting layer, causing the organic light emitting material of the light emitting layer to photoluminescence so as to further increase luminance efficiency and brightness of the OLED. The transparent conductive film layer can protect the conductive film layer with a light reflective function. Since the OLED further increases utility efficiency of light, injection efficiency of electrons from the cathode and holes from the anode in the OLED is increased, which in turn improves the luminance efficiency and image display quality of the organic light emitting display panel.

The base substrate of the array substrate according to the above embodiment can be a glass substrate and can also be a flexible substrate. If the base substrate is a flexible substrate, the flexible substrate may be made of a polymer material such as a polyvinyl alcohol thin film, a polyimide thin film, a polyester thin film.

The current low temperature polysilicon is made at a high temperature condition and is not suitable to be prepared on a flexible substrate that is not heat-resistant or has a lower melting point, and thus the manufacturing of a display device such as a flexible display device or an electronic paper with a lower cost and a higher performance is limited. And the above-mentioned thin film transistor TFT according to the present disclosure does not need to be prepared at a high temperature condition (for example exceeding a temperature of 200° C.), a chemical vapor deposition method or a coating method can be used to deposit carbon nanotube with semiconductor properties or graphene with semiconductor properties and is suitably performed on a flexible substrate, and thus the manufacturing process of making a flexible substrate can be simplified and the manufacturing cost can be reduced.

It is should be noted that, as illustrated in FIG. 2, similar to structure of a conventional array substrate, prior to making each film layer of the OLED, the method further comprises forming a passivation layer 38 on the TFT, the passivation layer 38 disposed between the anode 42 and the source/drain electrodes 33/34 that are disposed in the same layer. The array substrate further comprises a pixel defining layer 44 (i.e. a pixel separation film) disposed between the anode 42 and the light emitting layer 43.

Embodiment 3: Organic Light Emitting Display Panel

Embodiments of the present disclosure also provide an organic light emitting display panel comprising the array substrate mentioned above. The organic light emitting display panel can be any product or member with a display function, such as an electronic paper, an OLED panel, a digital photo frame, a cell phone, a tablet computer and so on.

In an organic light emitting display panel according to one embodiment of the present disclosure, the active layer in the thin film transistor is made of carbon nanotube with semiconductor properties or graphene with semiconductor properties so that the carriers of the semiconductor has a better mobility and the organic light emitting display device has a better stability. Meanwhile, a first conductive layer and a second conductive layer are formed on upper and lower sides of the active layer, respectively, with the first conductive layer and the second conductive layer formed of a secondary electron emission layer with an electron multiplication function, so that the electrons in the TFT active layer produce a multiplication effect, and finally the output electrons increase exponentially, increasing mobility of the electrons, making the carrier mobility of the TFT great enough to be comparable to the carriers mobility of the low temperature polysilicon.

Embodiment 4: Manufacturing Method of the Thin Film Transistor

According to the fourth embodiment of the present disclosure, a method for manufacturing the thin film transistor is provided, comprises the following steps:

A step of manufacturing an active layer and a first conductive layer and a second conductive layer disposed on upper and lower sides of the active layer and in contact with the active layer; the active layer being made of carbon nanotube with semiconductor properties or graphene with semiconductor properties, and each of the first conductive layer and the second conductive layer being formed of a secondary electron emission layer with an electron multiplication function.

The thin film transistor further comprises other structures such as the gate, the source/drain electrodes and the gate insulating layer and etc. The step of manufacturing the thin film transistor comprising the above structure can use existing methods and will not be described redundantly. The material of the gate, the source/drain electrodes and the gate insulating layer can be a metal or alloy for making the gate, the source/drain electrodes and the gate insulating layer known to a person skilled in the art, or be formed of a carbon nanotube or graphene conductive material.

For example, the secondary electron emission layer with an electron multiplication function is formed of a metal oxide or a metal organic compound.

The step of manufacturing the active layer and the first conductive layer and the second conductive layer disposed on upper and lower sides of the active layer and in contact with the active layer can comprise:

Step S11, depositing a layer of a secondary electron emission layer with an electron multiplication function on a base substrate to form patterns of the first conductive layer;

Step S12, depositing a layer of carbon nanotube film layer with semiconductor properties or graphene film layer with semiconductor properties on the base substrate formed with the secondary electron emission layer with an electron multiplication function through a chemical vapor deposition method or a coating method to form patterns of the active layer, wherein the carbon nanotube film layer with semiconductor properties can be a carbon nanotube film layer undergone an ultraviolet irradiation and an oxidation treatment, and the graphene film layer with semiconductor properties can be a graphene film layer undergone a hydrogen or an argon treatment.

Step S13, forming a layer of a secondary electron emission layer again, on the base substrate formed with the carbon nanotube film layer with semiconductor properties and or the graphene film layer with a semiconductor properties, to form patterns of the second conductive layer;

Step S14, performing a patterning process to the two secondary electron emission layers on the base substrate and the carbon nanotube film layer with semiconductor properties or the graphene film layer with semiconductor properties, forming patterns of the first conductive layer, patterns of the active layer and patterns of the second conductive layer, and the patterns of the second conductive layer being disposed between the source/drain electrodes to be formed and the active layer and corresponding to the source/drain electrodes to be formed.

In the present embodiment, as illustrated in FIG. 2, the second conductive layer has a pattern with a slit having a set width, that is, an opening is formed in the film layer (i.e. the active layer 35) formed by the carbon nanotube or the graphene material to form a slit having a set width (i.e. the second conductive layer), with the opening extending to the active layer 35 longitudinally and the slit corresponding to a slit between the source/drain electrodes to be formed (that is, a slit having a set width similar to that in conventional techniques is provided between the source/drain electrodes 33/34).

In the present embodiment, a layer of MgO (or BeO or a metal organic compound) can be deposited by sputtering (the layer will be used for making the first conductive layer), then a layer of carbon nanotube undergone an ultraviolet irradiation and an oxidation treatment or graphene undergone a hydrogenization (or argon) treatment is prepared by a chemical vapor deposition method or a coating method (the layer will be used for making an active layer), so that the treated carbon nanotube or the treated graphenen has semiconductor properties; and then a layer of MgO (or BeO or a metal organic compound) is deposited again by sputtering (the layer will be used for making the second conductive layer).

When the thin film transistor comprises a source/drain electrodes and the source/drain electrodes are formed of carbon nanotube or graphene with conductor properties, the above step for manufacturing the thin film transistor can further comprise a step of making the source/drain electrodes, comprising:

Step S15, depositing a layer of carbon nanotube or graphene film layer with conductor properties on the base substrate formed with patterns of the first conductive layer, the active layer and the second conductive layer;

Step S16, performing a patterning process to the layer of carbon nanotube or graphene with conductor properties to form patterns of the source/drain electrodes on the second conductive layer.

In the present embodiment, since the active layer of the present disclosure is different from current amorphous silicon or polysilicon active layers, the active layer is made of carbon nanotube or the graphene with semiconductor properties, the source/drain electrodes are formed of carbon nanotube or graphene material with a conductor properties and the etching condition of forming the active layer, material for the source/drain electrodes is similar to those for forming the first conductive layer and the second conductive layer, it is possible to complete the process through one mask, exposing, developing, lithography etching etc. so that the yield of the product is improved to at a maximum degree while the manufacturing processes of the product are saved greatly, and as a result the mutual influence between the layers, due to deviation in alignment caused by multiple masks, exposing, developing, lithography etching or different etching condition, which results in decrease of the yield of the product, is avoid.

The conventional thin film transistor can further comprise a gate and a gate insulating layer etc., and the above manufacturing method can further comprise a step of manufacturing a gate and a gate insulating layer and etc. When the thin film transistor is of bottom gate type, the structure of the bottom gate type thin film transistor comprises an gate insulating layer disposed above the gate, an active layer disposed above the gate insulating layer and source/drain electrodes disposed above the active layer, and further comprises a first conductive layer under the active layer and a second conductive layer under the source/drain electrodes.

Therefore, in the process of manufacturing the thin film transistor, the method can further comprise the following steps before the step S11:

Step 11-1, forming patterns comprising a gate on the base substrate through a patterning process;

Depositing a layer of metal film layer such as a Mo metal film layer on a glass substrate or a flexible substrate (hereinafter referred to as a base substrate), and then forming patterns at least comprising a gate 31 on the base substrate as illustrated in FIG. 2 through a patterning process. And at the same time, patterns of a gate line can be formed at the same time.

Step 11-2, forming a gate insulating layer on the base substrate formed with the gate line through a patterning process;

For example, forming a gate insulating layer 32 covering the whole base substrate 1 on the gate 31 as illustrated in FIG. 2 through coating.

Then, after the step 11-2, a layer of secondary electron emission layer with an electron multiplication function can be deposited on the base substrate to form patterns of the first conductive layer, and then the above steps S12-S16 are performed sequentially.

When the thin film transistor is of top gate type, the top gate type thin film transistor comprises source/drain electrodes under the active layer, a gate insulating layer above the active layer, a gate above the gate insulating layer, a first conductive layer above the active layer, and a second conductive layer under the active layer and above the source/drain electrodes.

Therefore, the exemplary method for manufacturing the top gate type thin film transistor can comprise:

Step 21, depositing a layer of carbon nanotube or graphene film layer with conductor properties;

Step 22, performing a patterning process to the carbon nanotube or graphene film layer with conductor properties to form patterns of source/drain electrodes;

Step 23, depositing a layer of secondary electron emission layer with electron multiplication function on a base substrate formed with the source/drain electrodes, to form patterns of the second conductive layer.

The step 23 is slightly different from the step S11 in the exemplary embodiment described above in that the film layer for forming the second conductive layer is deposited first.

Step 24, forming a layer of carbon nanotube film layer with semiconductor properties or graphene film layer with semiconductor properties on the substrate formed with the secondary electron emission layer with electron multiplication function through a chemical vapor deposition method or a coating method, to form patterns of the active layer. This step is the same as the above step S12;

Step 25, forming a layer of secondary electron emission layer with electron multiplication function again on the base substrate after the step 24, to form the patterns of the first conductive layer;

Step 26, performing a patterning process to the two secondary electron emission layer on the substrate and the carbon nanotube film layer with semiconductor properties or the graphene film layer with semiconductor properties, to form the patterns of the first conductive layer, patterns of the active layer and patterns of the second conductive layer, and the second conductive layer disposed between the source/drain electrodes and the active layer and corresponding to the source/drain electrodes.

The step is slightly different from the step S14 in the exemplary embodiment described above in that the second conductive layer is disposed over the source/drain electrodes, whereas the second conductive layer is disposed under the source/drain electrodes when the thin film transistor is of bottom gate type.

Step 27, forming a gate insulating layer on the substrate formed with the gate line on the base substrate after the step 26, through a patterning process;

For example, a gate insulating layer covering the whole substrate on the substrate formed with the patterns of the first conductive layer, the patterns of the active layer and the patterns of the second conductive layer, can be formed by coating.

Step 28, forming patterns comprising a gate on the substrate through a patterning process, on the base substrate after the step 27;

For example, a layer of metal film layer such as a Mo metal film layer is deposited on the gate insulating layer by a conventional sputtering technique, and then patterns including at least a gate are formed on the substrate through a patterning process or patterning of a gate line is possible to be formed simultaneously.

It should be noted that patterns of the first conductive layer, patterns of the active layer, patterns of the second conductive layer, patterns of the source/drain electrodes of the above example can be formed through one patterning process, and can also be formed through various patterning processes.

For example, patterns of the first conductive layer, the active layer and the second conductive layer are formed through one patterning process, while the patterns of the source/drain electrodes are formed individually. Or, patterns of the first conductive layer, patterns of the active layer, patterns of the second conductive layer and patterns of the source/drain electrodes are formed through one patterning process.

The manufacturing processes for the thin film transistor are similar to those in a conventional technique, which will not be described redundantly herein. If the first conductive layer, the active layer and the second conductive layer are formed in one patterning process, or if the first conductive layer, the active layer, the second conductive layer, the source/drain electrodes are formed in one patterning process, the yield of the product is relatively high and the process procedures are saved.

In the example described above, a thickness of the first conductive layer is 40-50 nm and a thickness of the second conductive layer is 40-50 nm.

It should be noted that, referring to FIG. 2, the method mentioned above for manufacturing a thin film transistor can further comprise a step of forming a passivation layer 38 and forming a via hole 47 (the area where the via hole 47 is located is as illustrated by the enclosed dashed line in FIG. 2) on the passivation 38 by a conventional method. For example, a passivation layer 38 is formed on the base substrate 1 on which patterns of the source/drain electrodes are formed, and a via hole 47 is formed in a region of the passivation layer corresponding to the pattern of the drain electrode 34, through patterning processes.

Figure 3:
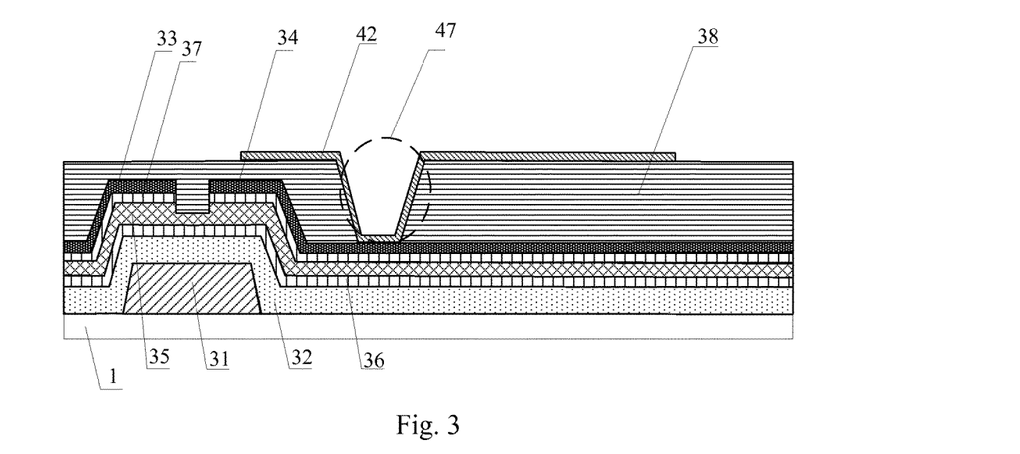
FIG. 3 is a view schematically illustrating a structure of a TFT having a passivation layer according to an embodiment of the present disclosure.

For example, the passivation layer 38 as illustrated in FIG. 2 is formed on the source/drain electrodes by coating resin through a resin coating technique and through technology such as exposing, developing and lithography etching etc., and an opening with a set dimension as illustrated in FIG. 3 is formed in a region of the passivation layer 38 corresponding to the drain electrode 34, the opening being the via hole 47.

Embodiment 5: A Manufacturing Process for the Array Substrate

Next, the process of manufacturing a thin film transistor in a pixel unit and the process of manufacturing an OLED will be described.

The process of manufacturing the thin film transistor can be any one of the processes of manufacturing a thin film transistor according to the above embodiments and the process of manufacturing an OLED will be explained hereinafter.

An OLED is formed according to a thin film transistor manufactured by the method provided the above embodiments, which at least comprises an anode, a pixel defining layer, a light emitting layer and a cathode.

Figure 4:
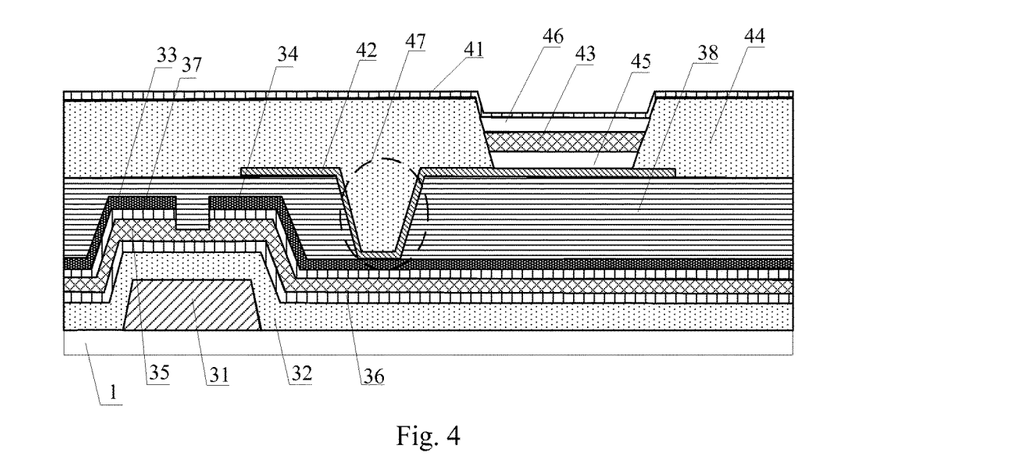
FIG. 4 is a view schematically illustrating a structure of an OLED formed with a TFT and a light emitting device according to an embodiment of the present disclosure.

To produce the array substrate as illustrated in FIG. 4, the manufacturing process of the OLED can comprise the following steps:

Step S31, forming patterns of an anode formed of carbon nanotube or graphene with conductor properties on the base substrate formed with the thin film transistor, and the anode connected to the drain of the thin film transistor.

For example, an TIO layer is deposited by a sputtering technique or a layer of carbon nanotube transparent conductive thin film (or graphene thin film) with conductor properties is deposited by a coating technique, and patterns of the anode 42 as illustrated in FIG. 4 are formed through a patterning process such as exposing, developing, lithography etching and etc.

Step S32, forming patterns of a pixel defining layer on the substrate formed with the patterns of the anode.

For example, as illustrated in FIG. 4, a resin layer is coated on the substrate 1 formed with the anode 42 by a coating technique, and a pixel defining layer 44 is formed through a patterning technique such as exposing, developing and lithography etching and etc. The pixel defining layer 44 is a film layer surrounding a pixel region for preventing color mixing of light emitting layer of different colors in adjacent pixel regions.

Step S33, forming patterns of the light emitting layer on the base substrate formed with the patterns of the pixel defining layer.

For example, as illustrated in FIG. 4, a light emitting layer (such as quinoline ketone) is formed by a coating technique or a vapor deposition technique, and patterns of a light emitting layer 43 are formed through a patterning process. It is also possible to form a hole transmission layer and an electron transmission layer, and it is further possible to form an electron blocking layer and a hole blocking layer. For example, a hole transmission layer 45, an electron blocking layer (not illustrated in FIG. 4), a light emitting layer 43, a hole blocking layer (not illustrated in FIG. 4) and an electron transmission layer 46 are formed above the pixel defining layer 44 through a coating technique or a vapor deposition technique and a patterning process.

Step S34, patterns of a cathode made of carbon nanotube or graphene material with conductor properties are formed on the light emitting layer on the base substrate formed with the patterns of the light emitting layer.

For example, an ITO layer is formed above the organic light emitting layer through a sputtering technique or a layer of carbon nanotube transparent conductive thin film (or graphene thin film) with conductive properties is deposited through a coating technique, and patterns of the cathode 41 as illustrated in FIG. 4 are formed through a patterning process, wherein the cathode is connected to a cathode grounding power supply (not illustrated) through a via hole (not illustrated), generates an electric field together with the anode so as to drive the light emitting layer to emit light.

In the array substrate according to the above embodiment, at least one of the cathode and the anode in the OLED is made of carbon nanotube or graphene material with conductor properties. Since atoms of the carbon nanotube or graphene are arranged regularly in a long range, they have a good conductive performance. And with respect to conventional metals or metal oxidizes used as the cathode 41 and the anode 42 of the OLED, the carbon nanotube or graphene has better conductive performance, the OLED has higher carrier transmission rate, contributing to the light emitting performance of the OLED.

In order to improve efficiency of light from the OLED, it is possible to provide a conductive film layer with light reflective function on the anode. For example, the process of forming the patterns of the anode in the above step S31 comprises:

Sequentially forming a conductive film layer having a light reflective function and a conductive film layer made of carbon nanotube or graphene with a conductor properties on the conductive film layer on the base substrate formed with the thin film transistor;

Forming patterns of the anode on the base substrate formed with the above conductive film layer through a patterning process.

For example, as illustrated in FIG. 4, a conductive film layer, such as a film layer formed of Mo, Al or Molybdenum aluminum alloy with a light reflective function, is sputtered on the source/drain electrodes 33/34 through a sputtering technique, and then an ITO layer is deposited through a sputtering technique or a layer of carbon nanotube transparent conductive thin film (or graphene thin film) is deposited through a coating technique, and then patterns of the anode 42 as illustrated in FIG. 4 are formed through a technique such as exposing, developing, lithography etching and etc., wherein the anode 42 comprises a conductive film layer having a light reflective function above the drain electrode 34 and a carbon nanotube or graphene transparent conductive thin film with conductor properties above the conductive film layer.

Or, the conductive film layer with a light reflective function can be provided at the cathode. For example, the process of forming the cathode in the above step S34 can comprise:

Forming a conductive film layer with a light reflective function and a conductive film layer made of carbon nanotube or graphene with conductor properties on the conductive film layer on the base substrate formed with the patterns of the conductive film layer; and Forming patterns of the anode of the organic light emitting device on the base substrate formed with the above conductive film layer through a patterning process.

For example, a conductive film layer, such as a film layer formed of Mo, Al or Molybdenum aluminum alloy with a light reflective function, is sputtered on the base substrate formed with the patterns of the light emitting layer through a sputtering technique, and then an ITO (Indium Tin Oxides) thin film layer is deposited through a sputtering technique or a layer of carbon nanotube transparent conductive thin film (or graphene thin film) is deposited through a coating technique, and then patterns of the cathode 42 as illustrated in FIG. 4 are formed through a technique such as exposing, developing, lithography etching and etc., wherein the cathode 42 comprises a conductive film layer having a light reflective function above the light emitting layer and a carbon nanotube or graphene transparent conductive thin film above the conductive film layer.

The anode of the OLED according to the above embodiment employs a double-layered conductive film layer, i.e. a combination of an opaque conductive film layer and a transparent conductive film layer, so that the TFT base substrate is efficiently combined with the anode of the organic light emitting device, so as to reduce blocking of a portion of light by wirings of the anode and patterns of the TFT base and thus light emitting area is increased; and moreover, the anode employs a double-layered metal design, i.e. a combination of an opaque metal film and a transparent conductive thin film, so that light reflected by the anode can be efficiently utilized by making the reflected light go through the light emitting layer, to cause the light emitting material of the light emitting layer photoluminescent so that light emitting efficiency and brightness of the organic light emitting device is further improved. The transparent conductive film layer can protect the conductive film layer with a light reflective function. Since the OLED further increases efficiency of light, injection efficiency of electrons from the cathode and holes from the anode in the OLED is improved, which in turn improves the light emitting efficiency and image display quality of the organic light emitting display panel.

It should be noted that the process of manufacturing the OLED can further comprise: forming a surrounding protective layer for covering the whole substrate on the cathode, for example, coating a layer of resin through a resin coating technique, and then forming a surrounding protective layer for a corresponding region by performing a patterning process to prevent external substances such as air, moisture and etc. from damaging the pixel electrode and/or the light emitting organic material.

The method of manufacturing the thin film transistor according to the embodiment of the present disclosure forms each film layer mainly through a sputtering or coating and patterning process, in a way that the process procedures are simple, requirements for the manufacturing apparatus are low, TFT with a higher carrier mobility can be manufactured only through an apparatus for manufacturing an amorphous silicon and the manufacturing cost of the product can be decreased.

In the embodiment of the present disclosure, the patterning process can only comprise a lithography process, or comprise a lithography process and an etching step, and at the same time, can comprise other processes for forming predetermined patterns, such as printing, inkjet and etc.; the lithography process refers to process procedures such as forming film, exposing and developing and so on for forming patterns from photoresist by means of an exposer and masks and etc. It is possible to choose corresponding patterning processes according to structures to be formed in the embodiments of the present disclosure.

The foregoing are merely exemplary embodiments of the invention, but are not used to limit the protection scope of the invention. The protection scope of the invention shall be defined by the attached claims.

The present disclosure claims priority of Chinese Patent Application No. 201410012665.4 filed on Jan. 10, 2014, the disclosure of which is hereby entirely incorporated by reference.

The invention claimed is:

1. A method for manufacturing a thin film transistor, comprising:
    manufacturing an active layer and a first conductive layer and a second conductive layer located on upper and lower sides of the active layer and in contact with the active layer,
    wherein the active layer is made of carbon nanotube with semiconductor properties or graphene with semiconductor properties, each of the first conductive layer and the second conductive layer is formed of a secondary electron emission layer with an electron multiplication function;
    wherein the thin film transistor further comprises source/drain electrodes, the method further comprising:
    manufacturing the source/drain electrodes, the source/drain electrodes being made of carbon nanotube or graphene with conductor properties; and
    wherein the manufacturing the active layer and the first conductive layer and the second conductive layer located on the upper and lower sides of the active layer and in contact with the active layer comprises:
        depositing one secondary electron emission layer with the electron multiplication function on a base substrate;

depositing a carbon nanotube film layer with semiconductor properties on the base substrate formed with the one secondary electron emission layer with the electron multiplication function through a chemical vapor deposition method or a coating method, or depositing a graphene film layer with semiconductor properties through a chemical vapor deposition method or a coating method;

further forming another secondary electron emission layer with the electron multiplication function on the base substrate formed with the carbon nanotube film layer with semiconductor properties or the graphene film layer with semiconductor properties; and performing a first patterning process to the one and the another secondary electron emission layers on the base substrate and the carbon nanotube film layer or the graphene film layer between the one and the another secondary electron emission layers, forming patterns of the first conductive layer, patterns of the active layer and patterns of the second conductive layer, the patterns of the second conductive layer being located between source/drain electrodes to be formed and the active layer and provided corresponding to the source/drain electrodes to be formed.

2. The method according to claim 1, wherein the one and the another secondary electron emission layers with the electron multiplication function are made of metal oxide or metal organic compound.

3. The method according to claim 1, wherein manufacturing the source/drain electrodes comprises:

depositing a layer of carbon nanotube or graphene film layer with conductor properties on the base substrate formed with the patterns of the first conductive layer, the patterns of the active layer and the patterns of the second conductive layer; and performing a second patterning process to the carbon nanotube or graphene film layer with conductor properties, to form patterns of the source/drain electrodes on the patterns of the second conductive layer.

4. The method according to claim 1, wherein the first conductive layer has a thickness of 40 to 50 nm and the second conductive layer has a thickness of 40 to 50 nm.

5. A method for manufacturing an array substrate, comprising manufacturing a thin film transistor for each pixel unit and a step of manufacturing an organic light emitting display device; and manufacturing the thin film transistor being achieved by performing the method according to claim 1.

6. The method according to claim 5, wherein manufacturing the organic light emitting display device comprises:

forming patterns of an anode on the base substrate formed with the thin film transistor, and the anode being connected with the drain electrode of the thin film transistor;

forming patterns of a pixel defining layer on the base substrate formed with the patterns of the anode;

forming patterns of a light emitting layer on the base substrate formed with the patterns of the pixel defining layer; and forming patterns of a cathode on the light emitting layer, on the base substrate formed with the patterns of the light emitting layer, wherein at least one of the anode and the cathode is made of carbon nanotube material or graphene with conductor properties.

7. The method according to claim 6, wherein forming patterns of an anode on the base substrate formed with the patterns of the thin film transistor comprises:

on the base substrate formed with the thin film transistor, sequentially forming a conductive film layer with a light reflective function and a conductive film layer formed of carbon nanotube or graphene material with conductor properties on the conductive film layer with the light reflective function; and forming the patterns of the anode on the base substrate formed with the conductive film layer through a third patterning process.

8. The method according to claim 6, wherein forming patterns of a cathode on the light emitting layer, on the base substrate formed with the patterns of the light emitting layer, comprises:

forming on the base substrate formed with the patterns of the light emitting layer, a conductive film layer with a light reflective function on the light emitting layer and a conductive film layer formed of carbon nanotube or graphene with conductor properties on the conductive film layer with the light reflective function; and forming the patterns of the cathode of the organic light emitting device on the base substrate formed with the conductive film layer through a fourth patterning process.

* * * * *